United States Patent [19]

Ota et al.

[11] Patent Number: 5,173,751
[45] Date of Patent: Dec. 22, 1992

[54] SEMICONDUCTOR LIGHT EMITTING DEVICE

[75] Inventors: Hiroyuki Ota; Atsushi Watanabe, both of Iruma, Japan

[73] Assignee: Pioneer Electronic Corporation, Tokyo, Japan

[21] Appl. No.: 736,471

[22] Filed: Jul. 26, 1991

[30] Foreign Application Priority Data

Jan. 21, 1991 [JP] Japan ................................ 3-5224
Jan. 21, 1991 [JP] Japan ................................ 3-5225

[51] Int. Cl.$^5$ .......................................... H01L 29/161
[52] U.S. Cl. ........................................ 257/76; 372/45; 257/43; 257/103; 257/94; 257/78
[58] Field of Search ..................... 357/17, 10, 16, 61; 372/45

[56] References Cited

U.S. PATENT DOCUMENTS

| | | | |
|---|---|---|---|
| 4,386,295 | 5/1983 | Fujita et al. | 357/10 |
| 4,697,202 | 9/1987 | Sher | 357/23.5 |
| 4,903,088 | 2/1990 | Van Opdorp | 357/17 |
| 5,006,908 | 4/1991 | Matsuoka et al. | 3576/17 |
| 5,076,860 | 12/1991 | Ohba et al. | 437/110 |
| 5,078,803 | 1/1992 | Pier et al. | 357/65 |

Primary Examiner—Andrew J. James
Assistant Examiner—Courtney A. Bowers
Attorney, Agent, or Firm—Perman & Green

[57] ABSTRACT

A semiconductor light emitting device has an epitaxial layer of which lattice match with a substrate crystal is made. The epitaxial layer is formed of mixed crystals of a plurality of Group III-V compound semiconductors on the substrate formed of a crystal of ZnO. More particularly, the expitaxial layer is formed of:

$Al_xGa_{1-x-y}In_yN$ ($0 \leq X < 1, 0 < Y < 1$)

where Ga of a semiconductor, GaN, is partially replaced with In or a combination of In and Al. As a result, an epitaxial layer of mixed crystals of GaInN or AlGaInN series is grown on the substrate. Also, the epitaxial layer is formed of:

$Al_pGa_{1-p-q}In_qN$ ($0 \leq p < 1, 0 < q < 1$) and $Al_xGa_{1-x}N_{1-y}P_y$ ($0 \leq X \leq 1, 0 < Y < 1$)

where Ga of a semiconductor, GaN, is partially replaced with In or Al, or N is partially is replaced with P. As the result, the epitaxial layer of mixed crystals of AlGaInN and AlGaNP series is grown on the substrate, the semiconductor light emitting device can produce an efficient emission of laser beam.

2 Claims, 2 Drawing Sheets

LATTICE CONSTANT (Å)

SEMICONDUCTOR LIGHT EMITTING DEVICE

BACKGROUND OF THE INVENTION

1. Field of the Invention

The present invention relates to a semiconductor light emitting device particularly for use in a laser apparatus.

2. Description of Background Information

In known semiconductor light emitting devices using an epitaxial layer of Group III-V nitride mixed-crystal, e.g. gallium nitride (GaN), sapphire ($\alpha$-Al$_2$O$_3$) is used as the material of the substrate crystal.

The crystal structure of GaN is of wurtzite type while sapphire forming the substrate has a crystal structure of corundum type. Although GaN and sapphire are both in the hexagonal system, the crystal structures of these compounds are not equivalent, as sapphire has a periodicity of thirteen atomic planes, for example. Also, these two compounds are different in the lattice constant, which in turn causes a lattice mismatch as high as 14%. Such a lattice mismatch leads to difficulties in growing an epitaxial layer having good properties and a semiconductor light emitting device using such an epitaxial layer would fail to produce an effective emission of laser beam.

OBJECT AND SUMMARY OF THE INVENTION

The present invention has been made to eliminate the foregoing disadvantages, and one object of the present invention is the provision of an improved semiconductor light emitting device in which an epitaxial layer is formed while lattice match with the crystal substrate is made and thereby producing efficient emission of laser beam.

A semiconductor light emitting device according to one embodiment of the invention has mixed crystals of a plurality of Group III-V compound semiconductors grown as an epitaxial layer over a crystal substrate, in which the crystal substrate is formed of ZnO and the mixed crystals of the epitaxial layer have compositions expressed by:

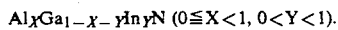

Al$_X$Ga$_{1-X-Y}$In$_Y$N ($0 \leq X < 1$, $0 < Y < 1$).

More particularly, in the semiconductor light emitting device according to the first aspect of the invention, gallium Ga in the epitaxial layer of GaN is partially replaced with indium In or a combination of indium In and aluminium Al, so that the epitaxial layer grows while lattice match with the substrate crystal ZnO is made.

A semiconductor light emitting device according to another embodiment of the present invention has mixed crystals of a plurality of Group III-V compound semiconductors grown as epitaxial layer over a crystal substrate, in which the crystal substrate is formed of ZnO, the mixed crystals of the epitaxial layer have compositions expressed by:

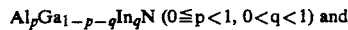

Al$_p$Ga$_{1-p-q}$In$_q$N ($0 \leq p < 1$, $0 < q < 1$) and

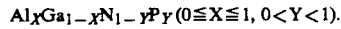

Al$_X$Ga$_{1-X}$N$_{1-Y}$P$_Y$ ($0 \leq X \leq 1$, $0 < Y < 1$).

More specifically, in the second embodiment of the semiconductor light emitting device according to the invention gallium Ga of the GaN epitaxial layer is partially replaced with indium In or aluminium Al, or nitrogen N of the GaN epitaxial layer is partially replaced with phosphorus P, so that the epitaxial layer is grown while lattice match with the substrate crystal ZnO is made.

DETAILED DESCRIPTION OF THE PREFERRED EMBODIMENTS

Figure 1:
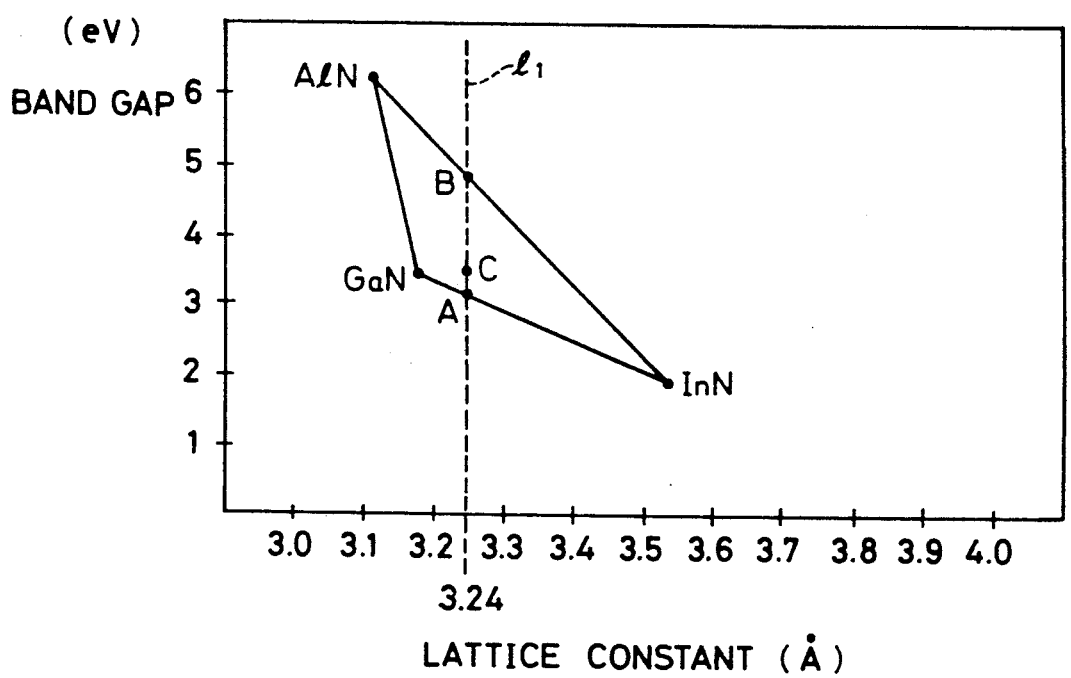
FIG. 1 is diagram showing the relation between band gap and lattice constant on Group III-V compound semiconductor materials and mixed crystals of those materials.

The relation between a lattice constant expressed on the X-axis and a band gap (forbidden band width) expressed on the Y-axis is shown in FIG. 1 in which &he points GaN, AlN, and InN represent three discrete Group III-V compound semiconductor materials: gallium nitride (GaN), aluminum nitride (AlN), and indium nitride (InN). Assume Vegard's rule for mixed crystals is applicable, a desired four-element mixed crystal material of which physical properties (the lattice constant and band gap) falls in the triangle area defined by the solid lines of FIG. 1 can be produced by mixing the three two-element semiconductor materials GaN, AlN, and InN at appropriate ratios. In addition, GaN, AlN, and InN shown in FIG. 1 are direct transition semiconductors and their band gaps represent the separation between the minimum and maximum energy levels in the conduction and valence bands respectively.

The straight line l$_1$ indicated as the dotted line in the figure represents a lattice constant 3.24Å of the substrate crystal ZnO. The substrate crystal ZnO has a crystal structure of wurtzite type, like GaN and its lattice constant has a value near to that of GaN. It is now assumed that the intersecting point between the line l$_1$ and the line of three-element mixed crystal between GaN and InN is denoted by A and the intersecting point between the line l$_1$ and the line of three-element mixed crystal between AlN and InN is denoted by B. By using the Vegard's rule, three-element compositions at the points A and B are then expressed as:

Point A: Ga$_{0.82}$In$_{0.18}$N
Point B: Al$_{0.69}$In$_{0.31}$N.

The line AB indicates a favorable range where the mixed crystal of GaInAlN assumes the lattice match with the substrate crystal ZnO. Hence, as a physical property on the line AB is realized by a mixed crystal (four-element mixed crystal) between the two compositions on the points A and B, lattice match with the substrate crystal ZnO will thus be made by an epitaxial layer having an approximate composition range which is expressed, assuming the Vegard's rule again, by:

(Ga$_{0.82}$In$_{0.18}$N)$_{1-w}$ $$(Al_{0.69}In_{0.31}N)_w \quad (1)$$

In fabrication of semiconductor laser devices, the formation of epitaxial layers in a so-called double-hetero-structure is generally adopted. In such a structure, it is considered desirable to set the band gap in each cladding layer about 0.3 eV greater than that of an active layer for effective trapping of photons in the active layer. Accordingly, when ZnO is used as the substrate crystal, it is sufficient to select, from the composition range expressed by the formula (1), compositions whose band gap difference is 0.3 eV, to form an epitaxial layer. More particularly, when the active layer is formed of the simplest composition at the point A shown in FIG. 1, the composition at the point C which provides a band gap of 0.3 eV greater than that of the point A composition may be employed for the cladding layers. The composition for the mixed crystal at the point C will be determined by using the formula (1) for four-element mixed crystal on the line $l_1$ and according to the Vegard's rule.

Figure 2:
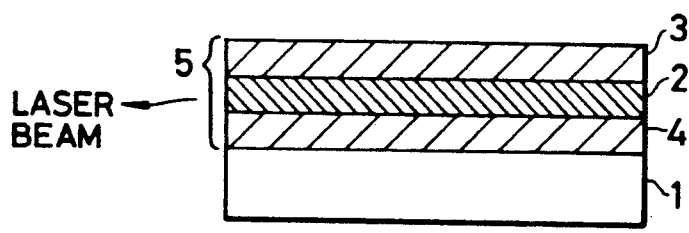
FIG. 2 is a cross-sectional view of a double-heterostructure semiconductor laser device showing one embodiment of the present invention.

FIG. 2 illustrates a cross-sectional view of an example of double-hetero structure semiconductor laser element in which the active and cladding layers are formed of a mixed crystal of $Al_XGa_{1-X-Y}In_YN$ ($0 \leq X < 1$, $0 < X < 1$) so that lattice match with the substrate crystal ZnO is made.

More specifically, n-type ZnO is used as the material of the substrate crystal 1, and an epitaxial layer 5 formed thereon is constituted by an active layer 2 of a mixed crystal $Ga_{0.82}In_{0.18}N$, and p and n type cladding layers 3 and 4 of a mixed crystal $Al_{0.12}Ga_{0.68}In_{0.20}N$. In operation, the semiconductor laser element having the structure described above produces photons in the active layer when a forward bias is applied across the cladding layers. The light is amplified through optical resonant action within the layers, causing stimulated emission of a laser beam from a cleavage surface of the active layer.

As the active layer is formed of $Al_XGa_{1-X-Y}In_YN$ ($0 < X < 1$, $0 < Y < 1$), a short wavelength laser beam covering blue to ultraviolet can be produced. Also, a light-emitting diode can be produced by forming a p-n junction with $Al_XGa_{1-X-Y}In_YN$ mixed crystals formed while establishing the lattice match with the ZnO substrate.

As described above in the first embodiment of the semiconductor light emitting device according to the present invention, lattice match of the epitaxial layer with the substrate crystal ZnO is made by partially replacing Ga of a semiconductor GaN in components of the epitaxial layer with In or a combination of In and Al. Accordingly, a desirable epitaxial layer of mixed crystals of GaInN series and AlGaInN series is grown on the substrate, so that a semiconductor light emitting device having an excellent light emitting efficiency can be produced.

A second embodiment of the semiconductor light emitting device according to the present invention will now be described referring with reference to the drawings.

Figure 3:
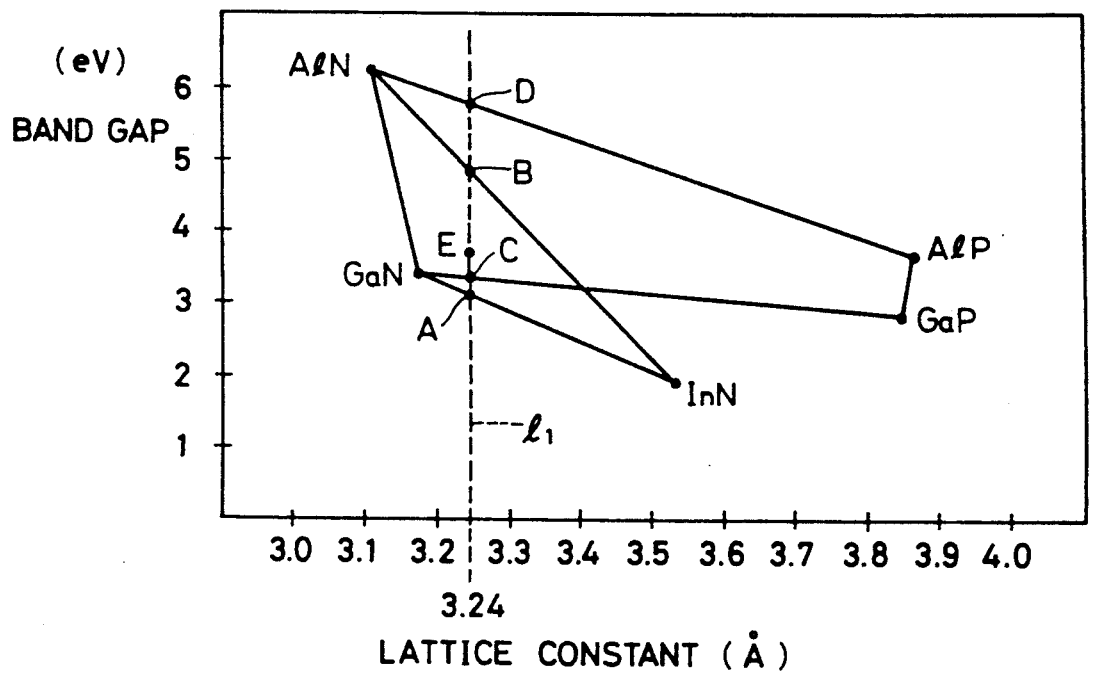
FIG. 3 is a diagram showing the relation between the band gap and the lattice constant on Group III-V compound semiconductor materials and mixed crystals of those materials.

FIG. 3 shows the relation between the lattice constant shown on the axis of abscissa and a band gap (forbidden energy gap) shown on the axis of ordinates, in which five points GaN, AlN, InN, GaP, and AlP represent properties of five discrete Group III-V compound semiconductor materials GaN, AlN, InN, GaP, and AlP respectively. Assume that the Vegard's rule for mixed crystals is applicable, a desired four-element mixed crystal of which the physical property (the lattice constant and band gap) falls in the triangular or trapeziform region enclosed by the solid lines in FIG. 3 can be produced by mixing five two-element semiconductor materials at an appropriate ratio. As shown in FIG. 3, the crystal structure of GaP and AlP is of sphalerite type and their lattice constants are converted to match with the nitrides GaN and AlN having the wurtzite type crystal structure. GaN, AlN, and InN are direct transition semiconductors and their band gaps represent the separation between the minimum and maximum energy levels of the conduction and valence bands, respectively. Also, GaP and AlP are indirect transition type semiconductor materials and their band gaps represent the separation between the minimum and maximum energy levels in the conduction and valence bands, respectively at $\Gamma$ point (wave number:$k=0$).

As in the case of FIG. 1, the straight line $l_1$ denoted by the dotted line represents the lattice constant 3.24Å of the substrate crystal ZnO.

In addition to the two points A and B, the intersection between the line $l_1$ and the line extending from GaN to GaP is denoted by the point C and the intersection between the line $l_1$ and the line from AlN to AlP is denoted by the point D. From the Vegard's rule, a couple of three-element compositions at the points C and D are then expressed as:

Point C: $GaN_{0.91}P_{0.09}$
Point D: $AlN_{0.82}P_{0.18}$

Two lines AB and CD respectively define composition ranges where lattice match of two discrete mixed crystals of AlGaInN and AlGaNP with the substrate crystal ZnO can be made respectively. Hence, as a physical property on each line is realized in a mixed (four- element) crystal having a composition between points A and B or C and D, the lattice match with the substrate crystal ZnO will thus be established by an epitaxial layer formed of materials having composition ranges which are expressed, assuming the Vegard's rule, by:

$$(Ga_{0.82}In_{0.18}N)_{1-V}$$
$$(Al_{0.69}In_{0.31}N)_V \quad (2)$$

and $$(GaN_{0.91}P_{0.09})_{1-W}$$
$$(AlN_{0.82}P_{0.18})_W \quad (3)$$

In fabrication of such semiconductor laser devices, it is general that the epitaxial layers are formed in a so-called double-hetero-structure. In such a structure, it is considered desirable that the band gap in each cladding layer is determined to be about 0.3 eV greater than that of the active layer for effective trapping of photons in the active layer. Accordingly it is desirable to form mixed crystals having compositions selected from the compositions expressed by the formulas (2) and (3), whose band gap difference is about 0.3 eV. More particularly, when the composition of the active layer is selected at the simplest point C on the mixed crystal of AlGaInN series as shown in FIG. 3, the composition at the point E which provides a band gap of 0.3 eV greater than that of the composition on the point C can be employed for developing the cladding layers. The composition on the point E on the mixed crystal of AlGaNP series different from mixed crystal series having a composition on the point C can be determined using the composition formula (3) for four-element mixed crystal on the line l₁ and according to the Vegard's rule.

Figure 4:
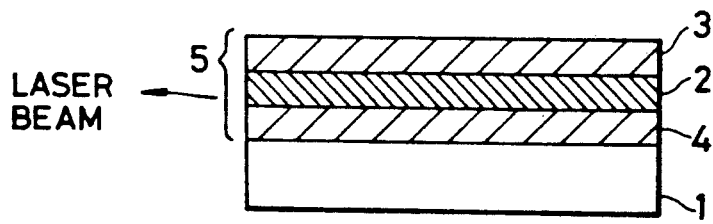
FIG. 4 is a cross-sectional view of a double-heterostructure semiconductor laser device showing another embodiment of the present invention.

FIG. 4 illustrates a cross-sectional view of a double-hetero-structure semiconductor laser device of which the active layer is formed of a mixed crystal of $Al_X Ga_{1-X} N_{1-Y} P_Y$ ($0 \leq X \leq 1$, $0 < Y < 1$) while establishing the lattice match with the substrate crystal ZnO and the two cladding layers are formed of a mixed crystal of $Al_p Ga_{1-p-q} In_q N$ ($0 \leq p < 1$, $0 < q < 1$).

More specifically, the substrate crystal 1 is formed of n-type ZnO, an active layer 2 is formed of a mixed crystal expressed as $GaN_{0.91}P_{0.098}$, and two cladding layers 3 and 4 are formed of, p- and n- type mixed crystals $Al_{0.20}Ga_{0.58}In_{0.22}N$ following the range of composition estimated as above, in which the three layers 2, 3, and 4 constitute an epitaxial layer 5.

Figure 5:
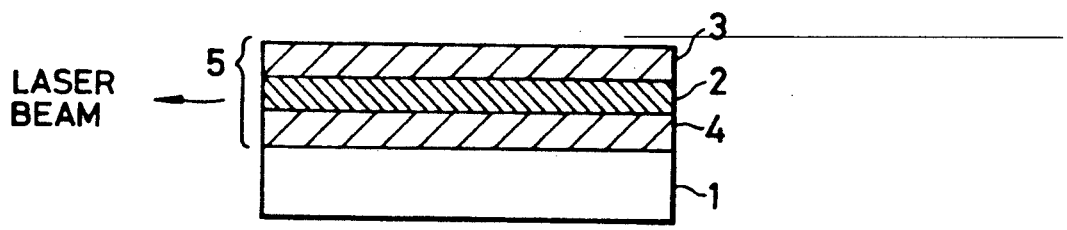
FIG. 5 is a cross-sectional view of a double-heterostructure semiconductor laser device showing a further embodiment of the present invention.

FIG. 5 shows a further embodiment of the present invention in which the active layer is formed of a mixed crystal of $Al_p Ga_{1-p-q} In_q N$ ($0 \leq p < 1$, $0 < q < 1$) and the two cladding layers are formed of a mixed crystal of $Al_X Ga_{1-X} N_{1-Y} P_Y$ ($0 \leq X \leq 1$, $0 < Y < 1$) in contrast with the arrangement of FIG. 4. In this case also, the composition of mixed crystals can be derived from the composition formulas (3) and (4). In the device, the substrate crystal 1 is formed of n type ZnO, and the active layer 2 is formed of a mixed crystal $Ga_{0.82}In_{0.18}N$ and two cladding layers 3 and 4 are formed of p- and n- type mixed crystals $GaN_{0.91}P_{0.09}$, wherein the layers 2 through 4 constitute an epitaxial layer 5.

It is known that the formation of an epitaxial layer of high quality with aluminium is difficult since aluminum is an active material. Hence, the composition of the mixed crystals in this embodiment is selected to satisfy x=0 and q=0, so that a hetero-structure crystal excluding Al is easily formed for each of layers. This selection of composition is also quite advantageous in fabrication of the laser devices.

In operation, the semiconductor laser devices having the structure described in the foregoing produces photons in the active layer when a forward bias is applied between the cladding layers. The light is amplified through optical resonant action across the layers and stimulated emission of laser beam takes place from a cleavage surface of the active layer.

Although the active and cladding layers of the preceding embodiments are respectively formed of the composition at the point A or C and the composition of which a band gap is 0.3 eV greater than that of the active layer as shown in FIG. 3, the selection of composition is not limited to those values and the composition may be selected appropriately from compositions expressed by the foregoing formulas. Similarly, a light-emitting diode can be built in which the p-n junction is formed between mixed crystals of $Al_p Ga_{1-p-q} In_q N$ and $Al_X Ga_{1-X} N_{1-Y} P_Y$ selected for making the lattice match with the substrate crystal ZnO.

As specifically described above, in the second embodiment of the semiconductor light emitting element according to the present invention, ZnO is used as the material of the substrate crystal, and the lattice match of the epitaxial layer with the substrate crystal of ZnO is made by partially replacing gallium Ga of a semiconductor GaN in the epitaxial layer with indium In or aluminium Al, or partially replacing nitrogen N of the semiconductor GaN with phosphorus P. Accordingly, a epitaxial layer of mixed crystals of AlGaInN series and AlGaNP series having a good quality is grown on the substrate, so that a semiconductor laser device having a high efficiency of emission of laser beam can be produced.

What is claimed is:

1. A semiconductor light emitting device having mixed crystals of a plurality of Group III–V compound semiconductors formed as an epitaxial layer over a substrate crystal, wherein the substrate crystal is formed of ZnO and the mixed crystals forming the epitaxial layer have compositions expressed by:

$$Al_X Ga_{1-X-Y} In_Y N \ (0 \leq X < 1, 0 < Y < 1).$$

2. A semiconductor laser diode having mixed crystals of a plurality of Group III–V compound semiconductors formed as an epitaxial layer over a substrate crystal, wherein the substrate crystal is formed of ZnO and the mixed crystals forming the epitaxial layer have compositions expressed by:

$$Al_p Ga_{1-p-q} In_q N \ (0 \leq p < 1, 0 < q < 1) \text{ or}$$

$$Al_X Ga_{1-X} N_{1-Y} P_Y \ (0 \leq X < 1, 0 < Y < 1).$$

* * * * *